US012584948B2

(12) United States Patent
Okawachi

(10) Patent No.: US 12,584,948 B2
(45) Date of Patent: Mar. 24, 2026

(54) CONSUMED POWER CALCULATION METHOD FOR ELECTRIC MOTOR AND INDUSTRIAL MACHINE

(71) Applicant: THE JAPAN STEEL WORKS, LTD., Tokyo (JP)

(72) Inventor: Ryo Okawachi, Tokyo (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 431 days.

(21) Appl. No.: 18/305,931

(22) Filed: Apr. 24, 2023

(65) Prior Publication Data

US 2023/0349958 A1    Nov. 2, 2023

(30) Foreign Application Priority Data

May 2, 2022    (JP) ................................. 2022-075869

(51) Int. Cl.
    *G01R 21/133*        (2006.01)
    *H02P 23/14*        (2006.01)
    *H02P 27/06*        (2006.01)

(52) U.S. Cl.
    CPC ............ *G01R 21/133* (2013.01); *H02P 23/14* (2013.01); *H02P 27/06* (2013.01)

(58) Field of Classification Search
    CPC .............. G01R 21/133; G01R 19/0092; H02P 23/14; H02P 27/06; H02P 2205/03
    See application file for complete search history.

(56) References Cited

U.S. PATENT DOCUMENTS

| | | | | |
|---|---|---|---|---|
| 5,099,186 A | * | 3/1992 | Rippel | .................... B60L 3/003 |
| | | | | 318/803 |
| 2008/0129243 A1 | * | 6/2008 | Nashiki | .................... H02K 3/28 |
| | | | | 318/701 |

(Continued)

FOREIGN PATENT DOCUMENTS

| | | |
|---|---|---|
| JP | 5044621 B2 | 10/2012 |
| JP | 2018-207622 A | 12/2018 |

OTHER PUBLICATIONS

Office Action issued Jan. 7, 2026 by the Japan Patent Office in Japanese Patent Application No. 2022-075869.

*Primary Examiner* — Tung S Lau
(74) *Attorney, Agent, or Firm* — Sughrue Mion, PLLC

(57)        ABSTRACT

A consumed power calculation method for an electric motor for calculating consumed power of the electric motor in an industrial machine including one or more electric motors supplied with a current and driven by an inverter, the consumed power calculation method including: measuring a current $I_m$ supplied to the electric motor; obtaining an output torque $T_m$ of the electric motor based on the current $I_m$; and calculating consumed power $W_m$ of the electric motor by the equation: $W_m = 2\pi \cdot T_m \cdot R_m/(\eta_m \cdot \eta_p)/60 + P_w$, where $R_m$ is a rotational speed of the electric motor, $\eta_m$ is a motor efficiency of the electric motor, $\eta_p$ is a power factor, and $P_w$ is a switching loss of the inverter.

10 Claims, 4 Drawing Sheets

(56)  References Cited

U.S. PATENT DOCUMENTS

| | | | |
|---|---|---|---|
| 2017/0141711 A1* | 5/2017 | Shino | ...................... H02P 27/08 |
| 2018/0351486 A1 | 12/2018 | Matsuura et al. | |
| 2021/0091704 A1* | 3/2021 | Ohsugi | ................... H02P 21/50 |

* cited by examiner

*FIG. 4*

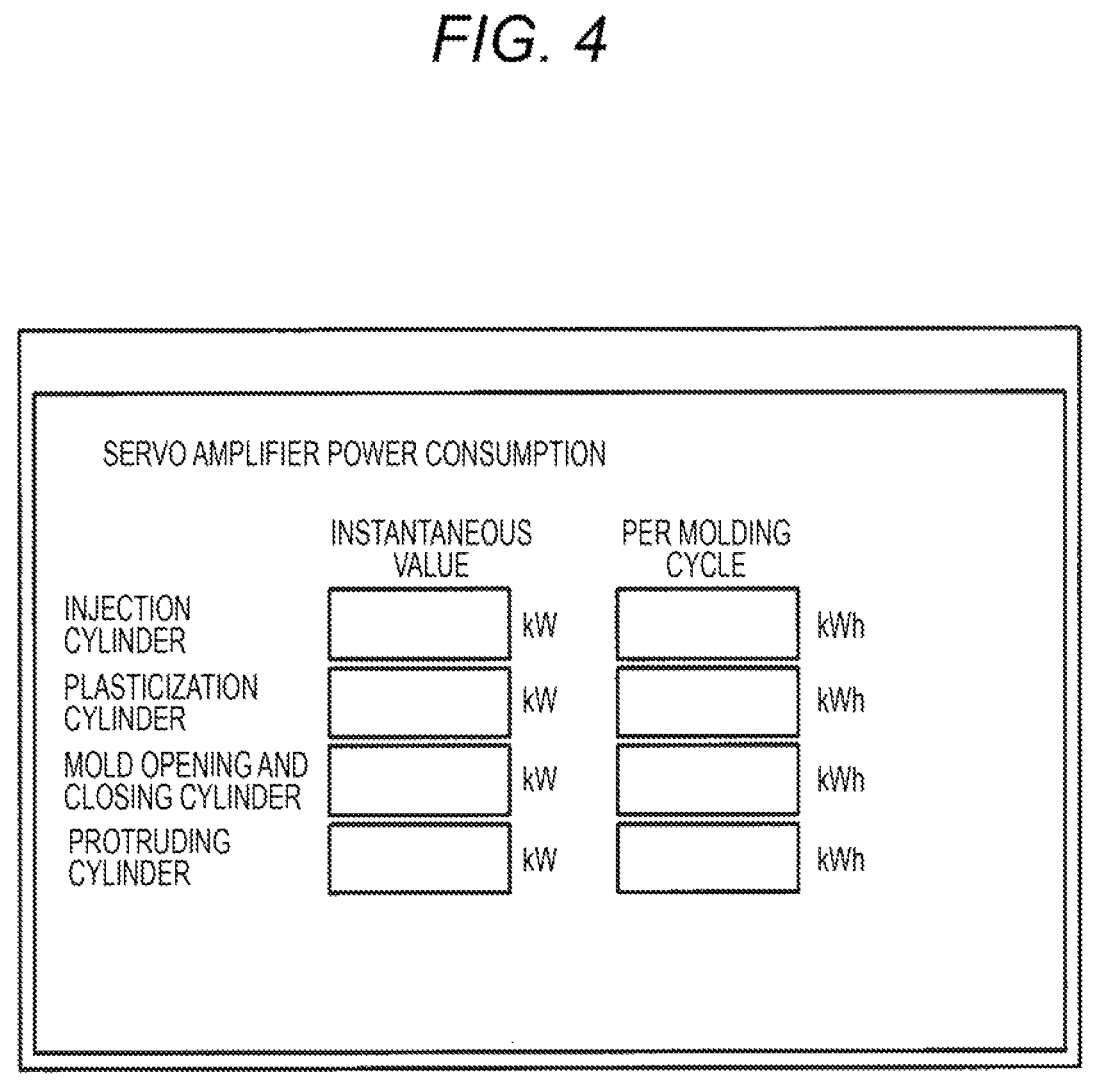

SERVO AMPLIFIER POWER CONSUMPTION

|  | INSTANTANEOUS VALUE | | PER MOLDING CYCLE | |
|---|---|---|---|---|
| INJECTION CYLINDER | | kW | | kWh |
| PLASTICIZATION CYLINDER | | kW | | kWh |
| MOLD OPENING AND CLOSING CYLINDER | | kW | | kWh |
| PROTRUDING CYLINDER | | kW | | kWh |

CONSUMED POWER CALCULATION METHOD FOR ELECTRIC MOTOR AND INDUSTRIAL MACHINE

CROSS-REFERENCE TO RELATED APPLICATIONS

This application is based on and claims priority under 35 USC 119 from Japanese Patent Application No. 2022-075869 filed on May 2, 2022, the entire content of which is incorporated herein by reference.

TECHNICAL FIELD

The present disclosure relates to a calculation method for calculating consumed power of an electric motor in an industrial machine including an electric motor driven by an inverter, and to the industrial machine.

BACKGROUND

There are various types of industrial machines driven by an electric motor, and examples thereof include an electric injection molding machine driven by an electric motor. The electric injection molding machine is provided with a converter and an inverter, and three-phase AC power supplied from a factory is converted into DC power by the converter. Then, the DC power is converted by the inverter into a three-phase AC current of a desired current at a desired frequency, and the converted three-phase AC current is supplied to the electric motor. That is, the electric motor is driven.

Japanese Patent No. 5044621 proposes a method for calculating consumed power of an electric motor provided in an injection molding machine. According to the method described in Japanese Patent No. 5044621, the consumed power of the electric motor is calculated based on a current detected by an inverter, that is, a servo amplifier, and a rotational speed detected by a rotary encoder. Although output torque of the electric motor is required in the calculation, the output torque is also calculated based on the current.

SUMMARY

The consumed power calculation method for an electric motor described in Japanese Patent No. 5044621 can calculate consumed power base on the current and the rotational speed, so that it has an excellent feature that it is not necessary to detect a voltage in the servo amplifier and it is not necessary to provide a voltmeter. However, problems to be solved are also found. Specifically, when the electric motor is not rotating, the consumed power is calculated as zero. For example, a molding cycle in an electric injection molding machine includes a pressure holding step. In the pressure holding step, it is necessary to generate torque by an injection cylinder servo motor that drives a screw and maintain pressure of the resin high. Since the torque is generated, the power is naturally consumed. However, since the screw hardly advances, the rotational speed is zero. In the consumed power calculation method described in Japanese Patent No. 5044621, there is a problem that the consumed power is taken as zero at this time.

The present disclosure provides a consumed power calculation method for an electric motor that does not require a voltmeter and can accurately calculate the consumed power of the electric motor even when the rotational speed of the electric motor is zero.

Other problems and novel features will become apparent from description of the present description and the accompanying drawings.

Illustrative aspects of the present disclosure provide a consumed power calculation method for an electric motor for calculating consumed power $W_m$ [W] of the electric motor in an industrial machine including one or more electric motors supplied with a current and driven by an inverter. The consumed power $W_m$ [W] of the electric motor is calculated by the following equation:

$$W_m = 2\pi \cdot T_m \cdot R_m / (\eta_m \cdot \eta_p) / 60 + P_w,$$

where $T_m$ is an output torque [Nm], $R_m$ is a rotational speed [rpm] of the electric motor, $\eta_m$ is a motor efficiency of the electric motor, $\eta_p$ is a power factor, and $P_w$ is a switching loss [W] of the inverter. The output torque $T_m$ is obtained based on detecting a current $I_m$ [A] supplied to the electric motor.

According to the present disclosure, even though the rotational speed $R_m$ of the electric motor is zero, the consumed power $W_m$ is not taken as zero and can be accurately calculated.

BRIEF DESCRIPTION OF DRAWINGS

FIG. 4 is a servo amplifier power consumption screen according to the present illustrative embodiment.

DESCRIPTION OF EMBODIMENTS

Figure 1:
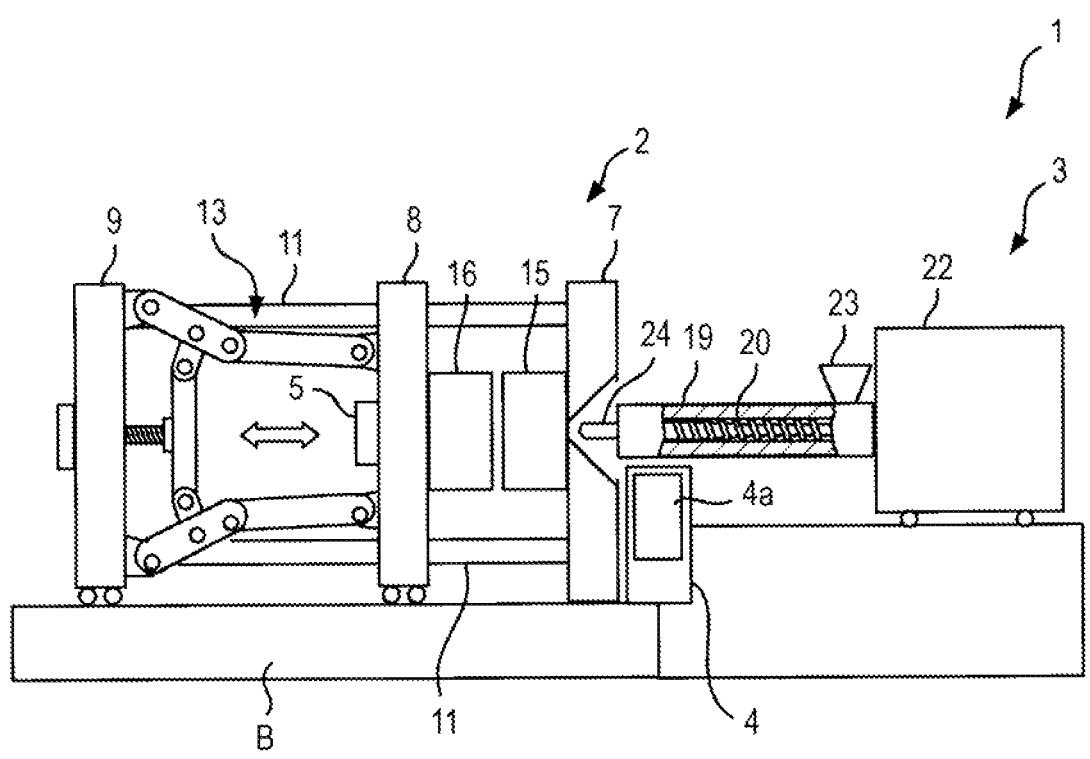
FIG. 1 is a front view showing an injection molding machine according to the present illustrative embodiment.

Hereinafter, illustrative embodiments will be described in detail with reference to the drawings. The present invention is not limited to the following illustrative embodiment. In order to clarify the description, the following description and the drawings are simplified as appropriate. In the drawings, the same elements are denoted by the same reference numerals, and repeated description thereof is omitted as necessary. Further, hatching may be omitted so as not to complicate the drawings.

A consumed power calculation method for an electric motor according to the present illustrative embodiment, which will be described in detail later, is a calculation method performed in an industrial machine including the electric motor. The industrial machine may be various machines such as a pressing machine, an extruder, and a lathe device. In the following description, an injection molding machine is taken as an example of the industrial machine, and the present illustrative embodiment will be described by using the injection molding machine.

{Injection Molding Machine}

As shown in FIG. 1, an injection molding machine 1 according to the present illustrative embodiment includes a mold clamping device 2, an injection device 3, a protrusion device 5, and the like. The injection molding machine 1 includes a controller, that is, a control device 4. The mold clamping device 2, the injection device 3, the protrusion device 5, and the like are controlled by the control device 4. That is, the control device 4 is configured to control the injection device 3, the protrusion device 5, and the like. The control device 4 is provided with a monitor 4a. Various screens are displayed on the monitor 4a.

{Mold Clamping Device}

The mold clamping device 2 includes a fixed plate 7, a movable plate 8 and a mold clamping housing 9. The fixed plate 7 is fixed to a bed B. The movable plate 8 is slidably provided on the bed B. The fixed plate 7 and the mold clamping housing 9 are coupled by a plurality of tie bars 11, 11, . . . . The movable plate 8 is slidable between the fixed plate 7 and the mold clamping housing 9. A mold clamping mechanism is provided between the mold clamping housing 9 and the movable plate 8. In the present illustrative embodiment, a toggle mechanism 13 is provided between the mold clamping housing 9 and the movable plate 8. The fixed plate 7 and the movable plate 8 are provided with a fixed mold 15 and a movable mold 16, respectively. Therefore, when the toggle mechanism 13 is driven, the molds 15 and 16 are opened and closed. The protrusion device 5 is provided on the movable plate 8. The protrusion device 5 is configured to protrude a molded product.

{Injection Device}

The injection device 3 includes a heating cylinder 19, a screw 20, and a screw driving device 22. The screw 20 is provided in the heating cylinder 19. The heating cylinder 19 is supported by the screw driving device 22. The screw 20 is driven in a rotation direction and an axial direction by the screw driving device 22. The heating cylinder 19 is provided with a hopper 23 and an injection nozzle 24.

When the injection device 3 is moved forward, the injection nozzle 24 is caused to touch the fixed mold 15. According to a command from the control device 4, the heating cylinder 19 is heated, an injection material is supplied from the hopper 23, and the screw 20 is rotated. Then, the injection material is melted and fed to a tip of the screw 20. That is, the injection material is measured. After the injection material is measured, the screw driving device 22 is controlled in accordance with a command from the control device 4 to drive the screw 20 in the axial direction. Then, the injection material is pushed forward as the screw 20 advances. That is, the injection material is injected into the molds 15 and 16.

{Power Supply System}

Figure 2:
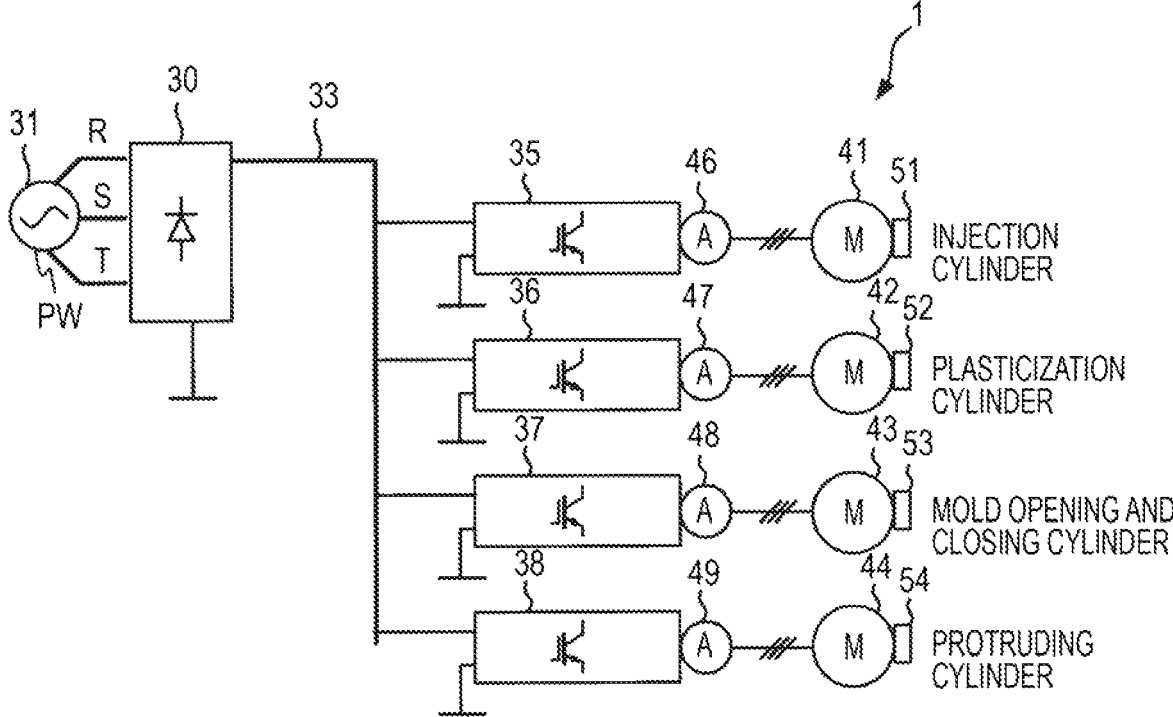
FIG. 2 is a power supply system diagram of an electric motor in the injection molding machine according to the present illustrative embodiment.

The injection molding machine 1 according to the present illustrative embodiment is driven by a servo motor, that is, an electric motor. A power supply system will be described. As shown in FIG. 2, the injection molding machine 1 according to the present illustrative embodiment is provided with a converter 30. The converter 30 is connected to a three-phase AC power supply 31 in a factory, and is also connected to a DC voltage line 33 provided in the injection molding machine 1. A plurality of inverters, that is, servo amplifiers 35, 36, 37, 38, . . . , are connected to the DC voltage line 33. Servo motors 41, 42, 43, 44, . . . , are connected to the servo amplifiers 35, 36, 37, 38, . . . , respectively. That is, an injection cylinder servo motor 41, a plasticization cylinder servo motor 42, a mold opening and closing cylinder servo motor 43, a protruding cylinder servo motor 44, . . . are provided.

The three-phase AC power from the three-phase AC power supply 31 is converted into DC power by the converter 30 and is supplied to the DC voltage line 33. Then, the DC power is converted into three-phase AC power of a desired current at a desired frequency by the servo amplifiers 35, 36, 37, 38, . . . , and is supplied to the servo motors 41, 42, . . . . As a result, the servo motors 41, 42, 43, 44, . . . are driven. In addition, regenerative power is recovered in the servo motors 41, 42, 43, 44, . . . , and is converted into DC power by the servo amplifiers 35, 36, 37, 38, . . . . When the converter 30 is a PWM converter, the regenerative power can be returned to the three-phase AC power supply 31.

The servo amplifiers 35, 36, 37, 38, . . . are provided with current sensors 46, 47, 48, 49, . . . , each of which is configured to measure a respective current. The current sensors 46, 47, 48, 49, . . . are configured to detect currents supplied to the servo motors 41, 42, 43, 44, . . . , respectively. The servo motors 41, 42, 43, 44, . . . are provided with rotary encoders 51, 52, 53, 54, . . . . The rotary encoders 51, 52, 53, 54, . . . are configured to detect rotational frequency of the servo motors 41, 42, 43, 44, . . . , respectively. The currents and rotational frequency are sent to the control device 4 (see FIG. 1).

Background of Present Disclosure

Before describing the consumed power calculation method for an electric motor according to the present illustrative embodiment, the background of the present disclosure will be described. In recent years, as represented by a so-called SDGs (sustainable development goal) or the like, saving of resources and reduction of energy consumption are required in various fields, and there is a similar demand for industrial machines. In an industrial machine including an electric motor, it is desired to review consumed power of the electric motor. In order to review the consumed power of the electric motor in the industrial machine, it is necessary to grasp the accurate consumed power of each electric motor. This is because, by clarifying the consumed power of each electric motor as a so-called "visualization", it is possible to review the driving of each electric motor, and as a result, the consumed power of the industrial apparatus as a whole is reduced.

In the electric motor, since the inverter is provided with the current sensors, the consumed power can be calculated using the current sensors. As a calculation method, for example, there is a consumed power calculation method described in Japanese Patent No. 5044621. However, according to the calculation method, the consumed power is calculated as zero when the electric motor is not rotating as described above. When "visualizing" the consumed power of each electric motor, there is a problem that the consumed power is indicated as zero even though the power is consumed.

Therefore, the inventors of the present disclosure have studied a calculation method capable of accurately calculating consumed power even when the electric motor is not rotating. The present inventors focus on the switching loss of the inverter as power generated when the electric motor is not rotating. This is because the switching loss is a power loss generated at the time of switching of a power semiconductor such as an IGBT (which is an abbreviation of Insulated Gate Bipolar Transistor) configuring the inverter, so that the switching loss is generated as long as the inverter generates a current even when the electric motor is not rotating. In general, the switching loss is treated as servo amplifier efficiency $\eta_{sa}$ ($\eta$b in Japanese Patent No. 5044621), which is a coefficient to be multiplied to power as in the method described in Japanese Patent No. 5044621. The present inventors have completed the present disclosure by reviewing the handling of the switching loss.

Consumed Power Calculation Method for Electric Motor According to Present Illustrative Embodiment The consumed power calculation method for an electric motor according to the present illustrative embodiment is performed by the control device 4 (see FIG. 1). The control device 4 calculates the consumed power $W_m$ [W] by the following equation:

$$W_m = 2\pi \cdot T_m \cdot R_m / (\eta_m \cdot \eta_p) / 60 + P_w \qquad \text{(Equation 1)}$$

where
$T_m$: output torque of the electric motor,
$R_m$: rotational speed [rpm] of the electric motor,
$\eta_m$: motor efficiency of the electric motor,
$\eta_p$: power factor, and
$P_w$: switching loss [W] of the inverter.
The switching loss $P_w$ is not a coefficient by which the power is multiplied, but is treated as a component to be added to the power. Thus, even if the rotational speed $R_m$ of the electric motor is zero, the consumed power $W_m$ does not become zero. Hereinafter, the individual elements configuring the calculation formula will be described.

Figure 3A:
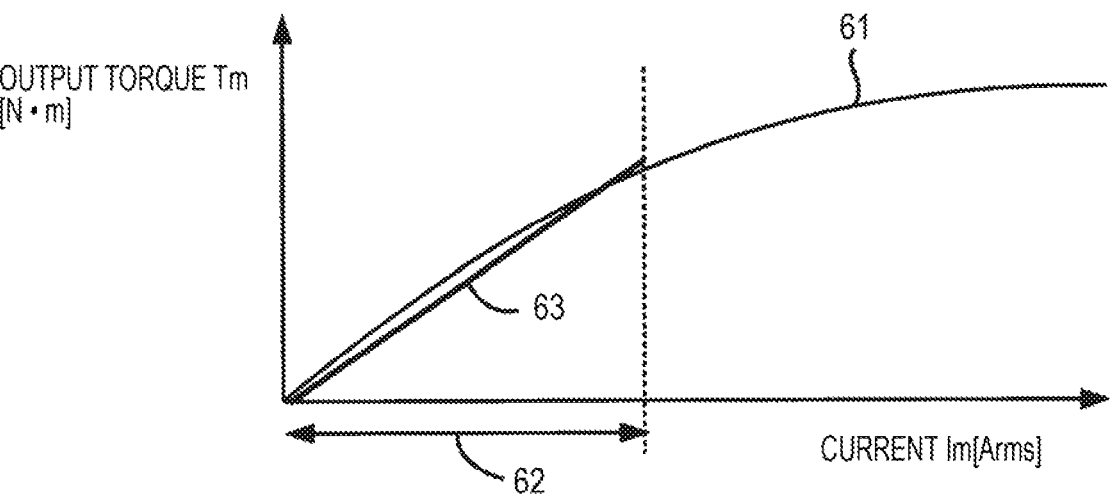
FIG. 3A is a graph showing a relationship between a current and output torque of a servo motor.

The output torque $T_m$ of the electric motor is output torque of the servo motors 41, 42, 43, 44, . . . (see FIG. 2), and is calculated based on a current $I_m$ measured by the current sensors 46, 47, 48, 49, . . . . A relationship between the current $I_m$ and the output torque $T_m$ varies depending on models of the servo motors 41, 42, 43, 44, . . . , but is generally the relationship of a graph 61 in FIG. 3A. The graph 61 shows a relationship between an effective value of the current $I_m$ and the output torque $T_m$. The output torque $T_m$ is obtained when the current $I_m$ is obtained. In the control device 4, a table representing the relationship between the effective value of the current $I_m$ and the output torque $T_m$ may be provided for each of the servo motors 41, 42, 43, 44, . . . , and the output torque $T_m$ may be calculated by linear interpolation or the like.

In the injection molding machine 1 according to the present illustrative embodiment, the current $I_m$ supplied to the servo motors 41, 42, 43, 44, . . . is controlled within a relatively high linearity range 62, for example, within a range of 100 Arms or less in terms of the effective value. In this range 62, the graph 61 can be regarded as a linear function 63. Therefore, in the injection molding machine 1 according to the present illustrative embodiment, the output torque $T_m$ is simply calculated, and is obtained by multiplying the current $I_m$ by a coefficient corresponding to a slope of the linear function 63.

The rotational speed of the electric motor is rotational speeds of the servo motors 41, 42, 43, 44, . . . , and is detected by the rotary encoders 51, 52, 53, 54, . . . . The motor efficiency $\eta_m$ of the electric motor is efficiency of the servo motors 41, 42, 43, 44, . . . , and is given as a coefficient unique to the models of the servo motors 41, 42, 43, 44, . . . .

Figure 3B:
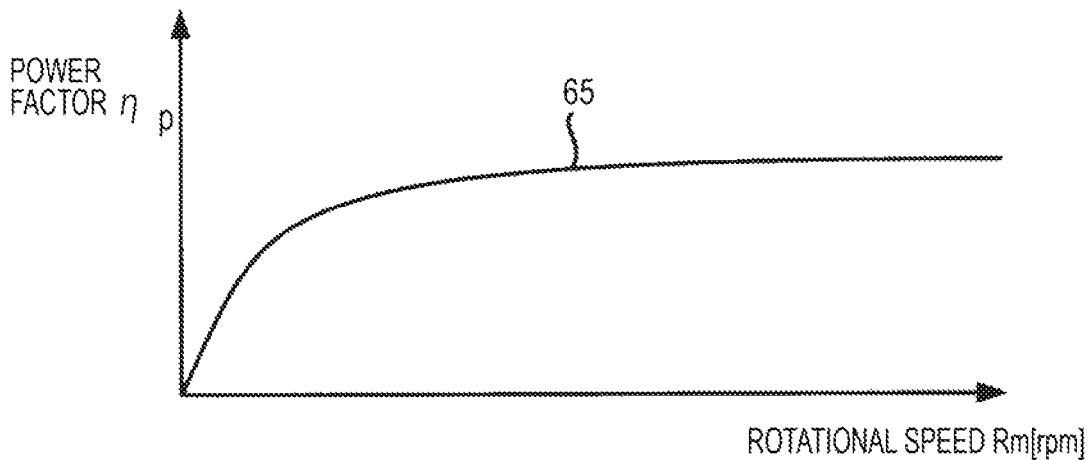
FIG. 3B is a graph showing a relationship between rotational frequency and a power factor of the servo motor.

As shown in a graph 65 of FIG. 3B, the power factor $\eta_p$ is given as a function of the rotational speeds $R_m$ of the servo motors 41, 42, 43, 44, . . . . The servo motors 41, 42, 43, 44, . . . are different depending on the model, and a table indicating the relationship is stored in the control device 4. Based on this table, the control device 4 obtains the power factor $\eta_p$.

Figure 3C:
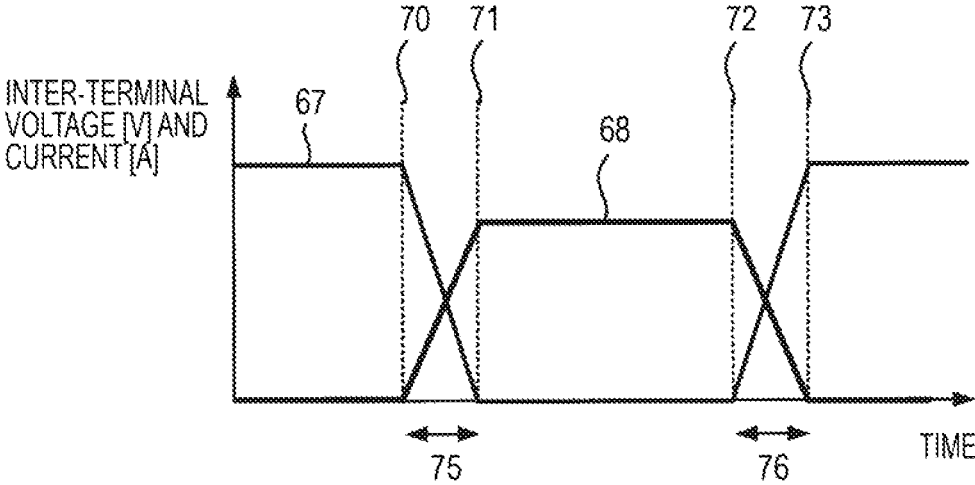
FIG. 3C is a graph showing changes in an inter-terminal voltage and an inter-terminal current when a switching operation is performed by a power semiconductor.

The switching loss $P_w$ is a power loss generated at the time of switching of a power semiconductor such as an IGBT or a MOSFET (which is an abbreviation of Metal-Oxide-Semiconductor Field-Effect Transistor). FIG. 3C shows changes in an inter-terminal voltage 67 and an inter-terminal current 68 between terminals of the power semiconductor, for example, between a collector and an emitter in the IGBT, and between a drain and a source in the MOSFET. It is assumed that a voltage is applied to a gate at a timing 70, and the application of the voltage is released at a timing 72. That is, switching is performed. Then, the inter-terminal voltage 67 decreases and the inter-terminal current 68 increases from the timing 70, and the inter-terminal voltage 67 and the inter-terminal current 68 become constant after a timing 71. On the other hand, the inter-terminal voltage 67 increases and the inter-terminal current 68 decreases from the timing 72, and both become constant after a timing 73. In this switching, power loss occurs in an increasing time period 75 and a decreasing time period 76.

The power loss of the power semiconductor is obtained by the following equation.

$$\text{Power loss} = (\tfrac{1}{6}) \cdot I_{max} \cdot V_{max} \cdot (T_r + T_f) \cdot f_{sw} \qquad \text{(Equation 2)}$$

where
$I_{max}$: maximum value of the inter-terminal current 68,
$V_{max}$: maximum value of the inter-terminal voltage 67,
$T_r$: increasing time period 75,
$T_f$: decreasing time period 76, and
$f_{sw}$: switching frequency.
The increasing time period $T_r$ and the decreasing time period $T_f$ are obtained by experiments.

Figure 3D:
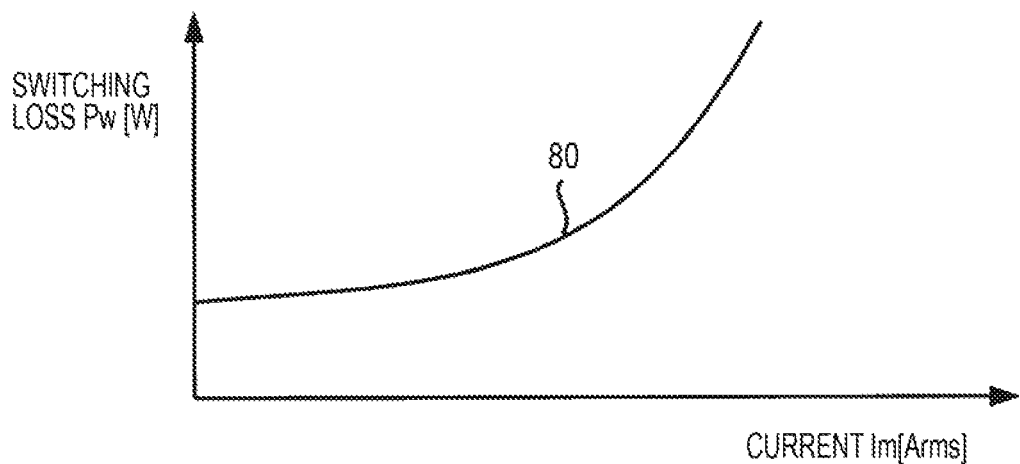
FIG. 3D is a graph showing a relationship between the current of the servo motor and a switching loss in an inverter.

The inverters, that is, the servo amplifiers 35, 36, 37, 38, . . . (see FIG. 2) are provided with three upper and lower arms, that is, a total of six power semiconductors. Therefore, the switching loss $P_w$ can be calculated by summing up these power losses. The maximum value $V_{max}$ of the inter-terminal voltage, the increasing time period $T_r$ and the decreasing time period $T_f$ constituting Equation 2 can be regarded as constant values. The switching frequency $f_{sw}$ can be changed in a plurality of patterns, but even if the switching frequency $f_{sw}$ is changed, the switching frequency $f_{sw}$ can be regarded as a constant value. Then, the power loss of Equation 2 can be handled as a function of the maximum value $I_{max}$ of the inter-terminal current. In this case, the switching loss $P_w$ of each of the servo amplifiers 35, 36, 37, 38, . . . is a function of the current $I_m$ flowing through each of the servo amplifiers 35, 36, 37, 38, . . . , and is as shown in a graph 80 of FIG. 3D. A table indicating a relationship of the graph 80 may be provided in the control device 4 (see FIG. 1), and the switching loss $P_w$ may be obtained based on the current $I_m$.
{Servo Amplifier Power Consumption Screen}

FIG. 4 shows a servo amplifier power consumption screen according to the present illustrative embodiment. This screen is displayed on the monitor 4a of the control device 4 (see FIG. 1). The consumed power $W_m$ of each of the servo amplifiers 35, 36, 37, 38, . . . of the injection cylinder servo motor 41, the plasticization cylinder servo motor 42, the mold opening and closing cylinder servo motor 43, the protruding cylinder servo motor 44, . . . is calculated by Equation 1 and is displayed as an instantaneous value. Further, the consumed power per molding cycle is calculated, and is also displayed.

Modifications of Present Illustrative Embodiment

Various modifications can be made for the present illustrative embodiment. For example, a method for calculating the switching loss $P_w$ may be modified. In the above description, the switching loss $P_w$ is calculated as a function of the current $I_m$ of the servo amplifiers 35, 36, 37, 38, . . . . However, for example, when the IGBT is employed as the power semiconductor, the switching loss $P_w$ can be simply given as a constant that does not depend on the current $I_m$. On the other hand, for example, when SIC is adopted as the power semiconductor, the switching loss $P_w$ can be set to zero when the current $I_m$ is zero, and can be given as a constant value when the current $I_m$ is larger than zero. A calculation method of the power factor $\eta_p$ can be modified, and the power factor $\eta_p$ may be given as a constant.

Although the invention made by the present inventors is specifically described based on the illustrative embodiment, it is needless to say that the present invention is not limited to the illustrative embodiment described above, and various modifications can be made without departing from the scope of the invention. A plurality of examples described above may be implemented in combination as appropriate.

What is claimed is:

1. A consumed power calculation method for an electric motor for calculating consumed power of the electric motor in an industrial machine including one or more electric motors supplied with a current and driven by an inverter, the consumed power calculation method comprising:

measuring a current $I_m$ supplied to the electric motor using a current sensor provided in the inverter;

obtaining an output torque $T_m$ of the electric motor based on the current $I_m$;

detecting a rotational speed $R_m$ of the electric motor using a rotary encoder; and calculating, by a controller of the industrial machine, consumed power $W_m$ of the electric motor by the following equation:

$$W_m = 2\pi \cdot T_m \cdot R_m / (\eta_m \cdot \eta_p) / 60 + P_w,$$

where $\eta_m$ is a motor efficiency of the electric motor, $\eta_p$ is a power factor, and $P_w$ is a switching loss of the inverter.

2. The consumed power calculation method for an electric motor according to claim 1, wherein the switching loss $P_w$ is given as a function of the current $I_m$.

3. The consumed power calculation method for an electric motor according to claim 1, wherein the switching loss $P_w$ is given as a constant.

4. The consumed power calculation method for an electric motor according to claim 1, wherein the power factor np is given as a function of the rotational speed $R_m$.

5. The consumed power calculation method for an electric motor according to claim 1, wherein the industrial machine is an injection molding machine.

6. An industrial machine comprising:

one or more electric motors supplied with a current and driven by an inverter; and a control device configured to:

measure a current $I_m$ supplied to the electric motor using a current sensor provided in the inverter;

obtain an output torque $T_m$ of the electric motor based on the measured current $I_m$;

detect a rotational speed $R_m$ of the electric motor using a rotary encoder;

calculate consumed power $W_m$ of the electric motor by the following equation:

$$W_m = 2\pi \cdot T_m \cdot R_m / (\eta_m \cdot \eta_p) / 60 + P_w,$$

where $\eta_m$ is a motor efficiency of the electric motor, $\eta_p$ is a power factor, and $P_w$ is a switching loss of the inverter; and display the consumed power $W_m$ of the electric motor on the control device.

7. The industrial machine according to claim 6, wherein the switching loss $P_w$ is given as a constant.

8. The industrial machine according to claim 6, wherein the switching loss $P_w$ is given as a constant.

9. The industrial machine according to claim 6, wherein the power factor $\eta_p$ is given as a function of the rotational speed $R_m$.

10. The industrial machine according to claim 6, wherein the industrial machine is an injection molding machine.

\* \* \* \* \*